(12) United States Patent
Nishizawa et al.

(10) Patent No.: US 9,484,883 B2
(45) Date of Patent: Nov. 1, 2016

(54) ACOUSTIC WAVE DEVICE AND FABRICATION METHOD OF THE SAME

(71) Applicant: TAIYO YUDEN CO., LTD., Tokyo (JP)

(72) Inventors: Toshio Nishizawa, Kanagawa (JP); Yasuyuki Saito, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 645 days.

(21) Appl. No.: 13/715,037

(22) Filed: Dec. 14, 2012

(65) Prior Publication Data

US 2013/0187730 A1 Jul. 25, 2013

(30) Foreign Application Priority Data

Jan. 24, 2012 (JP) ................................. 2012-012406

(51) Int. Cl.
*H03H 9/64* (2006.01)
*H03H 9/54* (2006.01)
(Continued)

(52) U.S. Cl.
CPC ........... *H03H 9/02952* (2013.01); *H03H 3/08* (2013.01); *H03H 9/0028* (2013.01); *H03H 9/059* (2013.01); *H03H 9/0542* (2013.01); *H03H 9/1078* (2013.01); *H03H 9/54* (2013.01); *H03H 9/64* (2013.01); *H03H 9/6489* (2013.01); *H03H 9/1092* (2013.01); *H03H 9/547* (2013.01); *H03H 9/568* (2013.01); *Y10T 29/42* (2015.01); *Y10T 29/49169* (2015.01); *Y10T 29/49171* (2015.01)

(58) Field of Classification Search
CPC .................... H03H 9/02125; H03H 9/02952; H03H 9/0028; H03H 9/0542; H03H 9/059; H03H 9/54; H03H 9/547; H03H 9/568; H03H 9/1078; H03H 9/1092; H03H 3/007; H03H 3/02; H03H 3/08; H03H 9/64; H03H 9/6489; H03H 9/02535; H03H 9/1071; Y10T 29/42; Y10T 29/49005; Y10T 29/49169; Y10T 29/49171
USPC .................................. 333/187, 189, 193, 195
See application file for complete search history.

(56) References Cited

U.S. PATENT DOCUMENTS 3,760,299 A * 9/1973 Vasile ............................ 333/151
4,065,734 A * 12/1977 Takeno et al. ................. 333/150
(Continued)

FOREIGN PATENT DOCUMENTS

DE 11 2005 000 043 T5 7/2006
DE 198 18 824 B4 7/2008
(Continued)

OTHER PUBLICATIONS

English language machine translation of JP 2008-066792, published Mar. 21, 2008, 19 pages.*
(Continued)

*Primary Examiner* — Barbara Summons
(74) *Attorney, Agent, or Firm* — Chen Yoshimura LLP

(57) ABSTRACT

An acoustic wave device includes: a substrate; an input terminal that is located on a first surface of the substrate, and to which a high-frequency signal is input; a resonator that is connected to the input terminal, and to which a high-frequency signal input to the input terminal is input; and an insulating layer that is located between the input terminal and the substrate, and has a permittivity smaller than that of the substrate.

15 Claims, 8 Drawing Sheets

(51) Int. Cl.
*H03H 9/02* (2006.01)
*H03H 3/08* (2006.01)
*H03H 9/00* (2006.01)
*H03H 9/05* (2006.01)
*H03H 9/10* (2006.01)
*H03H 9/56* (2006.01)

(56) References Cited

U.S. PATENT DOCUMENTS

| | | | |
|---|---|---|---|
| 5,789,845 A * | 8/1998 | Wadaka | H03B 5/326 |
| | | | 310/311 |
| 6,078,229 A * | 6/2000 | Funada et al. | 333/193 |
| 6,150,748 A * | 11/2000 | Fukiharu | 310/313 R |
| 6,519,822 B1 | 2/2003 | Stelzl et al. | |
| 7,046,102 B2 * | 5/2006 | Nakamura et al. | 333/133 |
| 7,682,988 B2 * | 3/2010 | Alshareef | H01L 21/265 |
| | | | 438/275 |
| 7,688,161 B2 * | 3/2010 | Miura et al. | 333/193 |
| 2002/0190814 A1 * | 12/2002 | Yamada et al. | 333/187 |
| 2004/0058473 A1 * | 3/2004 | Feiertag et al. | 438/108 |
| 2004/0066115 A1 | 4/2004 | Takamine | |
| 2004/0189146 A1 * | 9/2004 | Ueda et al. | 310/313 A |
| 2004/0196119 A1 | 10/2004 | Shibahara et al. | |
| 2005/0062167 A1 * | 3/2005 | Huang et al. | 257/778 |
| 2006/0017352 A1 * | 1/2006 | Tanielian | H03H 3/02 |
| | | | 310/324 |
| 2006/0049896 A1 * | 3/2006 | Onozawa | 333/193 |
| 2006/0138672 A1 | 6/2006 | Sakinada et al. | |
| 2007/0018756 A1 | 1/2007 | Fujii et al. | |
| 2008/0067896 A1 * | 3/2008 | Inoue et al. | 310/335 |
| 2010/0019867 A1 | 1/2010 | Tsuda | |
| 2010/0219912 A1 * | 9/2010 | Tanaka et al. | 333/195 |
| 2011/0006855 A1 | 1/2011 | Fujiwara et al. | |
| 2012/0105298 A1 | 5/2012 | Inoue et al. | |

FOREIGN PATENT DOCUMENTS

| | | |
|---|---|---|
| EP | 2 197 107 A2 | 6/2010 |
| JP | 6-152299 A | 5/1994 |
| JP | 6-291596 A | 10/1994 |
| JP | 9-107268 A | 4/1997 |
| JP | 2003-332874 * | 11/2003 |
| JP | 2004-88551 A | 3/2004 |
| JP | 2004-282707 A | 10/2004 |
| JP | 2006-80921 A | 3/2006 |
| JP | 2006-203149 A | 8/2006 |
| JP | 2008-066792 A * | 3/2008 |
| JP | 2010-28639 A | 2/2010 |
| JP | 2010-273200 A | 12/2010 |
| JP | 2011-71912 A | 4/2011 |
| JP | 2011-259516 A | 12/2011 |
| WO | 2006/009021 A1 | 1/2006 |
| WO | 2009/113274 A1 | 9/2009 |

OTHER PUBLICATIONS

German Office Action dated Dec. 5, 2014, in a counterpart German patent application No. 10 2013 000 191.9.
Japanese Office Action dated Nov. 24, 2015, in a counterpart Japanese patent application No. 2012-012406.
Japanese Office Action dated Mar. 15, 2016 in a counterpart Japanese patent application No. 2012-012406.
Japanese Office Action (Report of Reconsideration by Examiner before Appeal) dated Aug. 9, 2016, in a counterpart Japanese patent application No. 2012-012406.

* cited by examiner

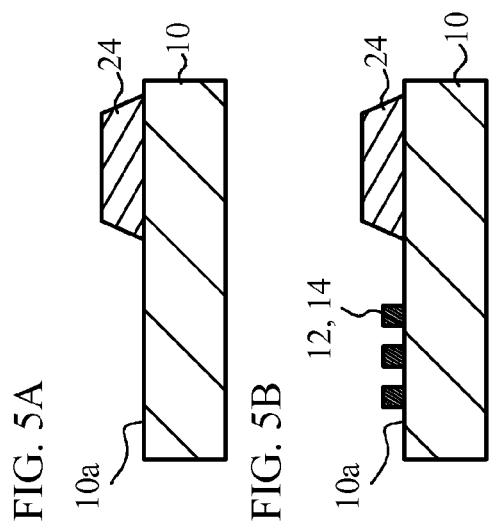
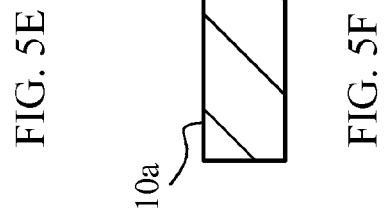
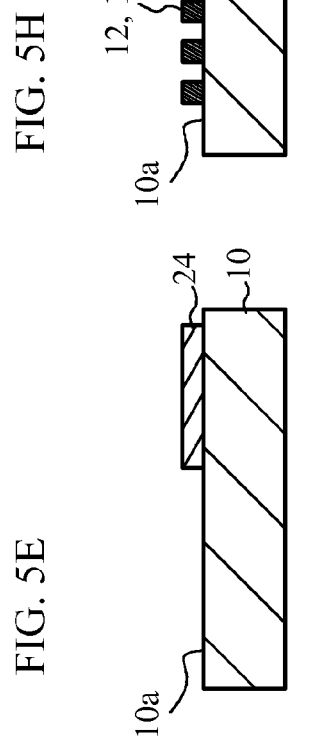
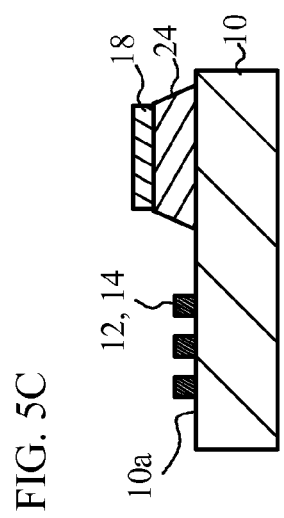
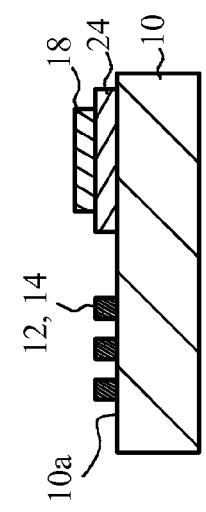
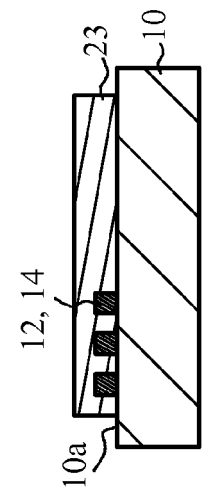

ACOUSTIC WAVE DEVICE AND FABRICATION METHOD OF THE SAME

CROSS-REFERENCE TO RELATED APPLICATION

This application is based upon and claims the benefit of priority of the prior Japanese Patent Application No. 2012-012406, filed on Jan. 24, 2012, the entire contents of which are incorporated herein by reference.

FIELD

A certain aspect of the present invention relates to an acoustic wave device and a fabrication method of the same.

BACKGROUND

There has been known acoustic wave devices such as SAW (Surface Acoustic Wave) devices and piezoelectric thin film resonator devices as filters and duplexers having an excellent high-frequency characteristic. Since high-frequency signals are used in the acoustic wave device, a parasitic capacitor formed by a terminal and a line pattern included in the acoustic wave device may cause deterioration in a frequency characteristic of the acoustic wave device. There is disclosed an invention that provides the line pattern on an insulating layer in Japanese Patent Application Publication No. 2004-282707 (Patent Document 1). There is disclosed an invention that provides the line pattern and the ground terminal on an insulating layer in Japanese Patent Application Publication No. 2004-88551 (Patent Document 2).

However, the techniques disclosed in Patent Documents 1 and 2 do not reduce the parasitic capacitance sufficiently. For example, when the substrate is made to be thin to reduce the height of the acoustic wave device, the parasitic capacitance between the front surface and back surface of the substrate increases.

SUMMARY OF THE INVENTION

According to an aspect of the present invention, there is provided an acoustic wave device including: a substrate; an input terminal that is located on a first surface of the substrate, and to which a high-frequency signal is input; a resonator that is connected to the input terminal, and to which a high-frequency signal input to the input terminal is input; and an insulating layer that is located between the input terminal and the substrate, and has a permittivity smaller than that of the substrate.

According to another aspect of the present invention, there is provided a fabrication method of an acoustic wave device including: forming an insulating layer on a first surface of a substrate, the insulating layer having a permittivity smaller than that of the substrate; forming an input terminal, to which a high-frequency signal is input, on the insulating layer; and forming a resonator, which is connected to the input terminal and to which a high-frequency signal input to the input terminal is input, on the first surface.

BRIEF DESCRIPTION OF THE DRAWINGS

FIG. 5A through FIG. 5D are cross-sectional views illustrating a first example of a fabrication method of the acoustic wave device in accordance with the second embodiment, FIG. 5E through FIG. 5G are cross-sectional views illustrating a second example of the fabrication method, and FIG. 5H through FIG. 5J are cross-sectional views illustrating a third example of the fabrication method;

DETAILED DESCRIPTION

Figure 1A:
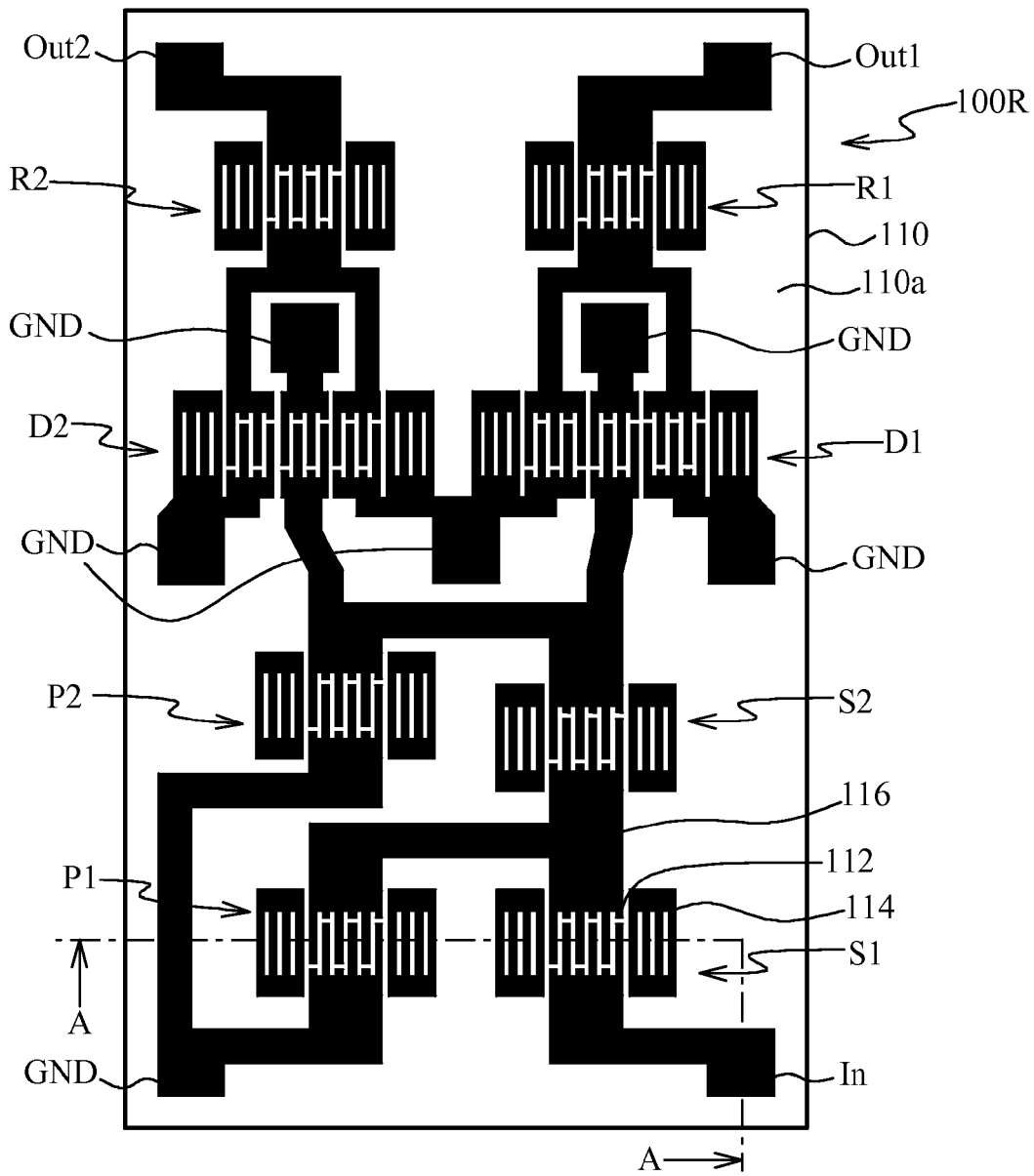
FIG. 1A is a plain view of an acoustic wave device in accordance with a comparative example.
Figure 1B:
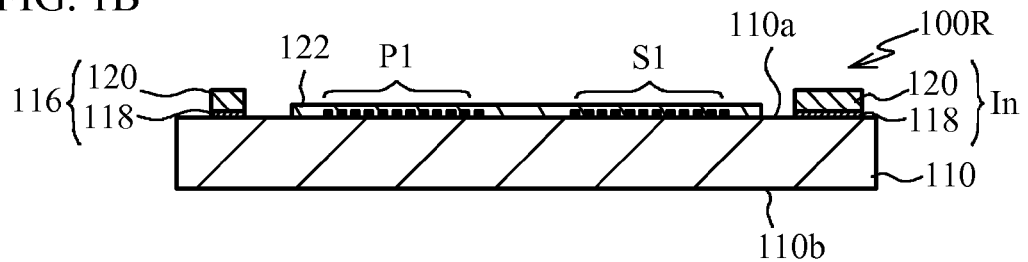
FIG. 1B is a cross-sectional view taken along line A-A in FIG. 1A.

A description will be first given of a comparative example. FIG. 1A is a plain view of an acoustic wave device 100R in accordance with the comparative example. FIG. 1B is a cross-sectional view taken along line A-A in FIG. 1A. A protective layer 122 is not illustrated in FIG. 1A. The number of electrode fingers may be changed.

As illustrated in FIG. 1A, the acoustic wave device 100R includes series resonators S1 and S2, parallel resonators P1 and P2, DMS (Double Mode SAW) resonators D1 and D2, and one-port resonators R1 and R2. The resonators S1, S2, P1 and P2 form a ladder-type filter. Each resonator is a SAW resonator including an IDT (InterDigital Transducer) 112 and reflectors 114 located on a surface 110a of a piezoelectric substrate 110. Terminals (input terminal In, output terminals Out1 and Out2, and ground terminal GND) are pads electrically connected to an external device of the piezoelectric substrate 110. The input terminal In is an unbalanced terminal, and the output terminals Out1 and Out2 are balanced terminals. Line patterns 116 connect the terminals and the IDTs 112, and interconnect the IDTs 112. High-frequency signals are input from the outside of the acoustic wave device 100R to the input terminal In, and are transmitted through the line patterns 116. The high-frequency signals are input to the IDT 112 of the series resonator S1 through the input terminal In and the line pattern 116. The ladder-type filter formed by the resonators S1, S2, P1 and P2 passes signals having a frequency in a passband out of the high-frequency signals, and suppresses signals having a frequency outside the passband. The high-frequency signal is filtered by the ladder-type filter, and then is separated into balanced signals. One of the balanced signals is filtered by the DMS resonator D1 and the resonator R1, and is output from the output terminal Out1. The other one of the balanced signals is filtered by the DMS resonator D2 and the resonator R2, and is output from the output terminal Out2.

As illustrated in FIG. 1B, the input terminal In and the line patterns 116 include a first layer 118, and a second layer 120 located so as to contact an upper surface of the first layer 118. The first layer 118, the IDTs 112 and the reflectors 114 are formed of a metal such as aluminum (Al) or copper (Cu), or of an alloy including these metals, and contact the surface 110a of the piezoelectric substrate 110. The second layer 120 is formed of a layer formed by stacking a titanium (Ti) layer and a gold (Au) layer in this order from a bottom side, of a metal layer such as Al, or of an alloy layer including these metals. The second layer 120 has a thickness thicker than that of the first layer 118, and a resistance lower than that of the first layer 118. The protective layer 122 formed of an insulating material is located on the IDTs 112 and the reflectors 114. The piezoelectric substrate 110 is formed of a piezoelectric substance such as 42° Y-cut lithium tantalate (LiTaO$_3$) or lithium niobate (LiNbO$_3$).

The terminals and line patterns 116 and the piezoelectric substrate 110 form a parasitic capacitor in a thickness direction of the piezoelectric substrate 110 which is a depth direction in FIG. 1A and a vertical direction in FIG. 1B. As a relative permittivity of LiTaO$_3$ is large, for example, approximately 40, a parasitic capacitance is large. The parasitic capacitor causes impedance mismatch. In addition, the high-frequency signal leaks to the thickness direction of the piezoelectric substrate 110. Impedance matching is possible by designing the acoustic wave device taking into account the parasitic capacitor, but even in this case, the high-frequency signal leaks. For example, the parasitic capacitance increases with reduction in the thickness of the piezoelectric substrate 110, and the high-frequency signal further leaks. In addition, when a metal layer is located on a surface 110b of the piezoelectric substrate 110 and the piezoelectric substrate 110 is sandwiched by the terminals and line patterns 116 and the metal layer, the parasitic capacitance further increases. As the high-frequency signal is input to the input terminal In, the input terminal In has an electric potential higher than those of the output terminals Out1 and Out2 and the ground terminal GND. Therefore, the high-frequency signal leaks especially at the input terminal In. As a result, an insertion loss of the acoustic wave device 100R deteriorates. A description will now be given of a first embodiment.

First Embodiment

Figure 2A:
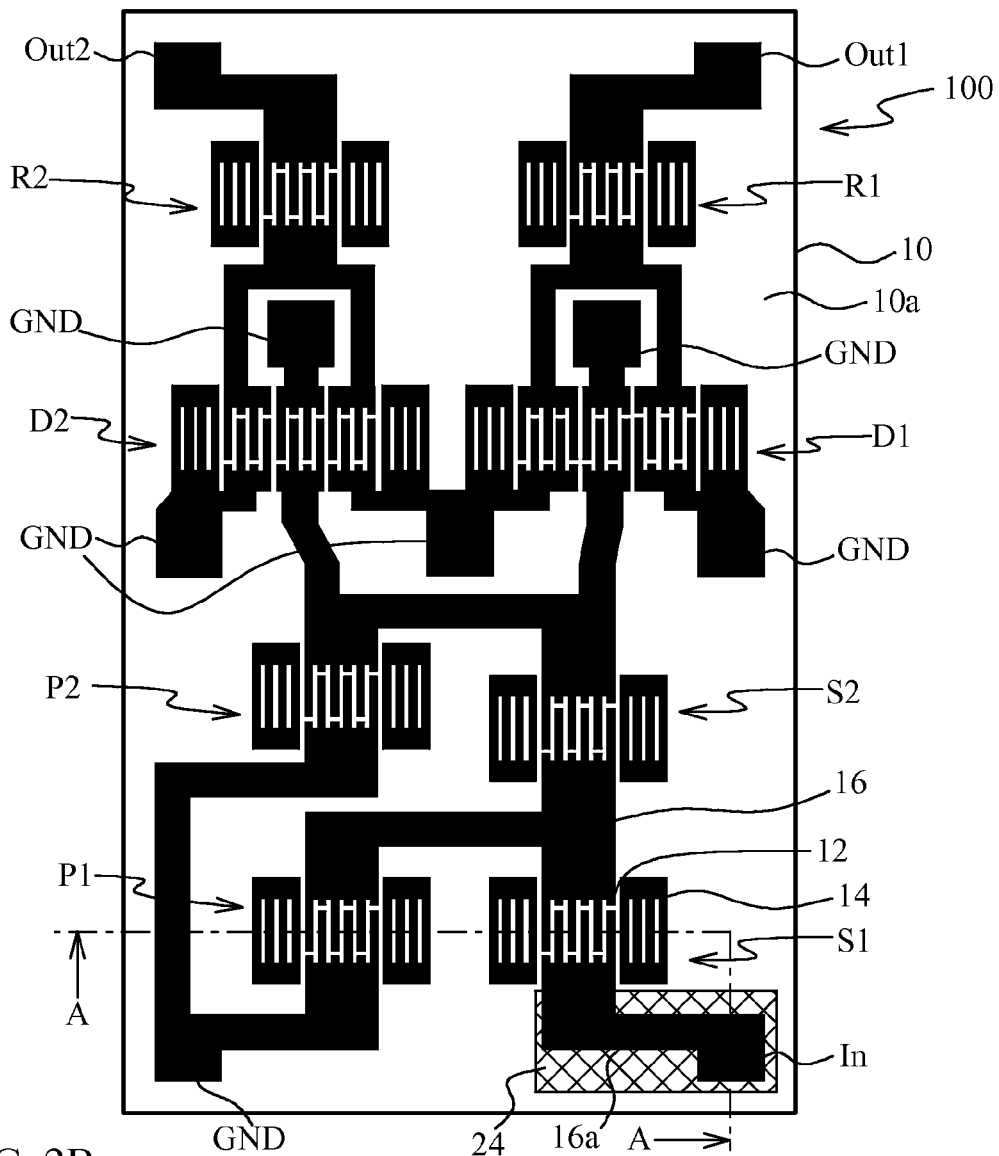
FIG. 2A is a plain view of an acoustic wave device in accordance with a first embodiment.
Figure 2B:
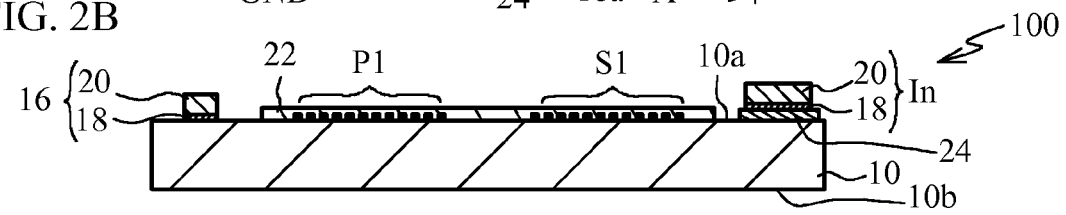
FIG. 2B is a cross-sectional view taken along line A-A in FIG. 2A.

The first embodiment provides an insulating layer on a piezoelectric substrate 10. FIG. 2A is a plain view of an acoustic wave device 100 in accordance with the first embodiment. FIG. 2B is a cross-sectional view taken along line A-A in FIG. 2A.

As illustrated by hatching in FIG. 2A, an insulating layer 24 is located on a surface 10a (first surface) of the piezoelectric substrate 10 (substrate). As illustrated in FIG. 2A and FIG. 2B, a line pattern 16a and the input terminal In are located on the insulating layer 24, where the line pattern 16a connects the input terminal In to an IDT 12 of the series resonator S1. As illustrated in FIG. 2B, the insulating layer 24 contacts the surface 10a of the piezoelectric substrate 10. A first layer 18 of the input terminal In and line pattern 16a contacts an upper surface of the insulating layer 24, and a second layer 20 contacts an upper surface of the first layer 18. The insulating layer 24 is not located between the output terminals Out1 and Out2 and the piezoelectric substrate 10, between the ground terminal GND and the piezoelectric substrate 10, or between line patterns 16 other than the line pattern 16a and the piezoelectric substrate 10. A protective layer 22 located on the IDTs 12 and reflectors 14 are formed of the same material as the insulating layer 24.

The insulating layer 24 is formed of an insulating material such as silicon oxide with a thickness of 150 nm for example. A relative permittivity of silicon oxide is approximately 4, and is smaller than that of LiTaO$_3$ which forms the piezoelectric substrate 10. This reduces the parasitic capacitance in the thickness direction of the piezoelectric substrate 10. As a result, the leakage of the high-frequency signal and the impedance mismatch are suppressed, and the frequency characteristic of the acoustic wave device 100 is improved. The input terminal In is applied with an electric potential higher than those applied to the output terminals Out1 and Out2 and the ground terminal GND, and the line pattern 16a has the same electric potential as the input terminal In. Thus, the leakage of the high-frequency signal through the parasitic capacitor easily increases. The first embodiment provides the insulating layer 24 between the input terminal In and the piezoelectric substrate 10 and between the line pattern 16a and the piezoelectric substrate 10, and thus reduces the parasitic capacitance in the input terminal In and the line pattern 16a. Therefore, the leakage of the high-frequency signal is effectively suppressed, and the frequency characteristic is significantly improved. In addition, even when the thickness of the piezoelectric substrate 10 is reduced, the increase in the parasitic capacitance is suppressed. Therefore, it is possible to achieve both of reduction in the height of the acoustic wave device 100 and a low-loss frequency characteristic. A thickness of the insulating layer 24 may be 100, 120, 180, 200, 250 or 300 nm, and the parasitic capacitance is reduced with increase in the thickness of the insulating layer 24. As the input terminal In and the line pattern 16a have the same electric potential, the insulating layer 24 is preferably provided under the input terminal In and the line pattern 16a. For example, when the IDT 12 of the series resonator S1 is directly connected to the input terminal In without the line pattern 16a, the insulating layer 24 may be provided between the input terminal In and the piezoelectric substrate 10.

Figure 2C:
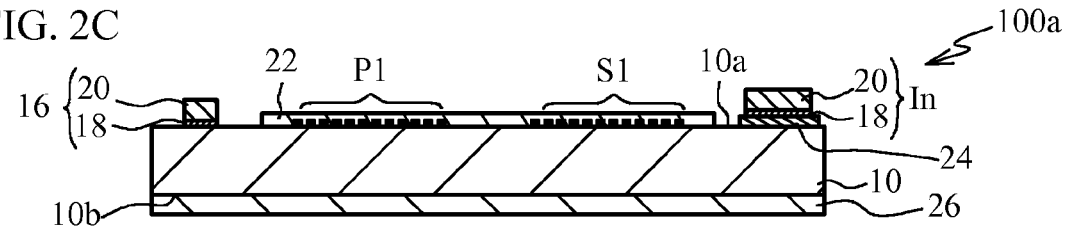
FIG. 2C is a cross-sectional view of an acoustic wave device in accordance with a variation of the first embodiment.

A description will now be given of a variation of the first embodiment. FIG. 2C is a cross-sectional view of an acoustic wave device 100a in accordance with the variation of the first embodiment. As illustrated in FIG. 2C, a metal layer 26 formed of Ti is provided so as to contact a surface 10b (second surface) opposite to the surface 10a of the piezoelectric substrate 10. When the piezoelectric substrate 10 and the insulating layer 24 are sandwiched by the input terminal In and line pattern 16a and the metal layer 26, the parasitic capacitor is formed. Since a relative permittivity of the insulating layer 24 is small, the increase in the parasitic capacitance is suppressed. As a result, the leakage of the high-frequency signal is suppressed. The metal layer 26 is provided to the whole of or a part of the surface 10b of the piezoelectric substrate 10.

Second Embodiment

Figure 3A:
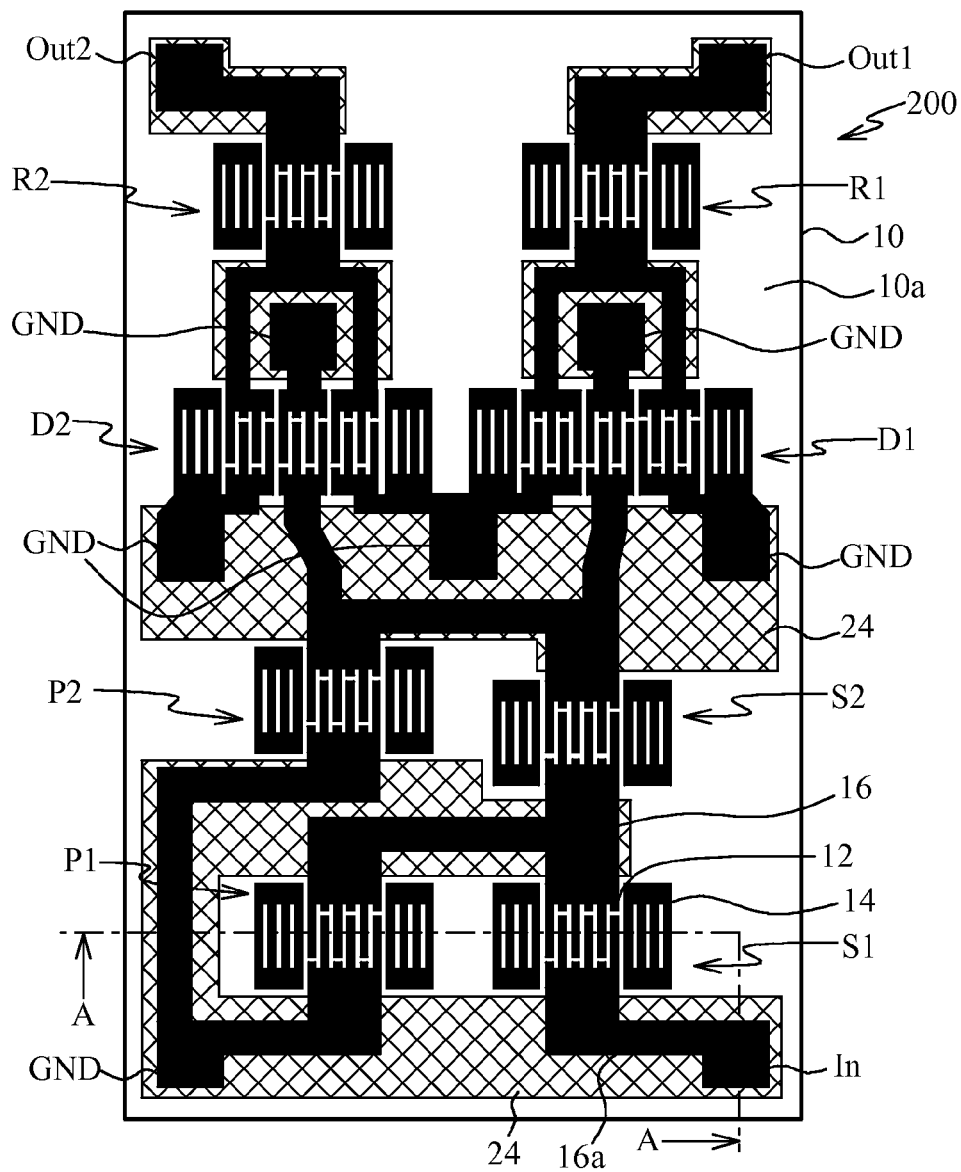
FIG. 3A is a plain view of an acoustic wave device in accordance with a second embodiment.
Figure 3B:
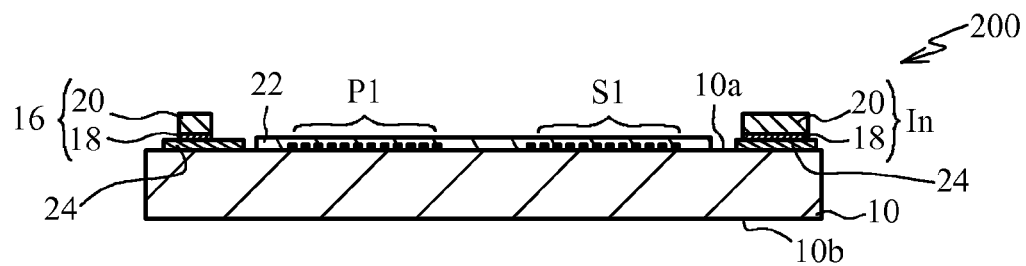
FIG. 3B is a cross-sectional view taken along line A-A in FIG. 3A.

A second embodiment changes a position to which the insulating layer 24 is provided. FIG. 3A is a plain view of an acoustic wave device 200 in accordance with the second embodiment. FIG. 3B is a cross-sectional view taken along line A-A in FIG. 3A.

As illustrated in FIG. 3A and FIG. 3B, the insulating layer 24 is provided between the surface 10a of the piezoelectric substrate 10 and the input terminal In, between the surface 10a and the output terminals Out1 and Out2, between the surface 10a and the ground terminal GND, and between the surface 10a and the line patterns 16 and 16a. The second embodiment improves the frequency characteristic by reducing the parasitic capacitance in the input terminal In and the line pattern 16a in the same manner as the first embodiment. Furthermore, the leakage of the high-frequency signal is effectively suppressed because the insulating layer 24 is provided under the line patterns 16, through which the high-frequency signal is transmitted, and the output terminals Out1 and Out2, from which the high-frequency signal is output.

A description will be given of simulations of frequency characteristics in the second embodiment and the comparative example. The calculation is carried out under the assumption that the acoustic wave devices 100R and 200 are reception filters of a duplexer supporting W-CDMA (Wideband Code Divided Multiple Access) Band VII. That is to say, a passband of each of the acoustic wave devices 100R and 200 is assumed to be located in a reception band of W-CDMA Band VII (2620 to 2690 MHz). A metal contacts the surface 110b of the piezoelectric substrate 110 in the comparative example, and the surface 10b of the piezoelectric substrate 10 in the second embodiment. The piezoelectric substrate 10 is assumed to be made of $LiTaO_3$, and to have a thickness of 0.25 mm. The insulating layer 24 is assumed to be made of silicon oxide, and to have a thickness of 150 nm.

Figure 4A:
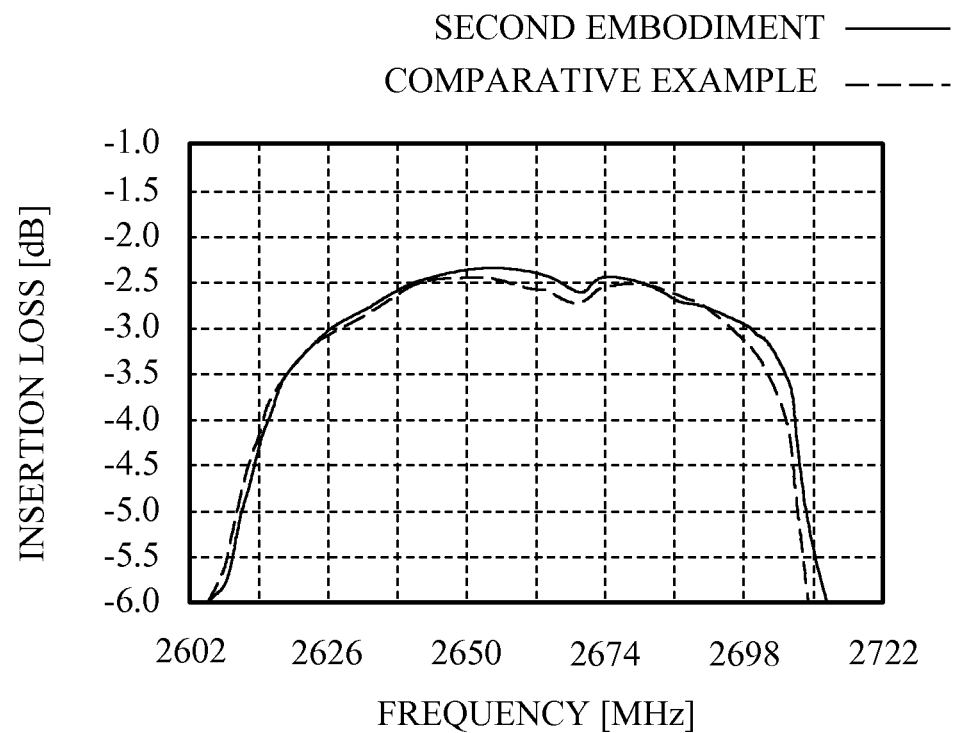
FIG. 4A is a graph illustrating calculation results of frequency characteristics.

FIG. 4A is a graph illustrating calculation results of frequency characteristics. A horizontal axis represents frequency, and a vertical axis represents insertion loss. A dashed line indicates calculation results of the comparative example, and a solid line indicates calculation results of the second embodiment. As illustrated in FIG. 4A, the second embodiment exhibits a frequency characteristic having an insertion loss less than that of the comparative example.

Figure 4B:
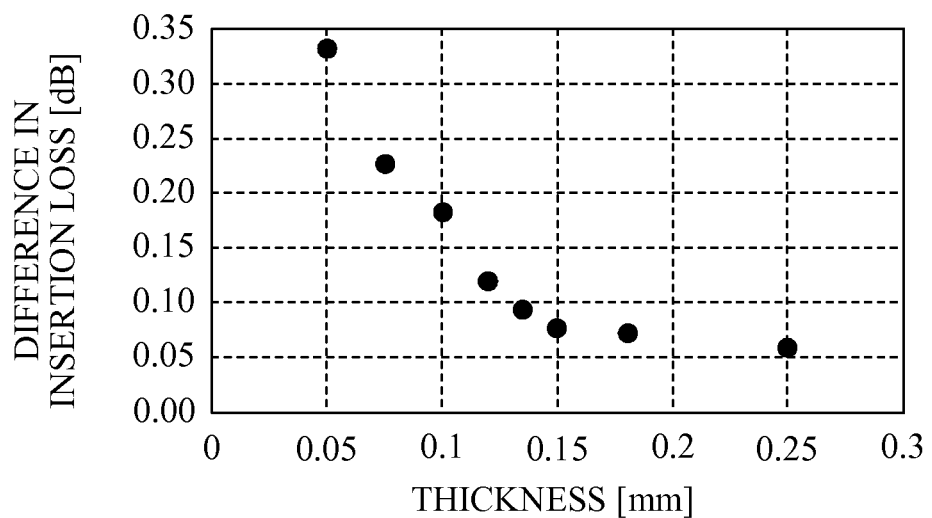
FIG. 4B is a graph illustrating difference in insertion loss.

In addition, difference in insertion loss is examined between the comparative example and the second embodiment by varying the thickness of the piezoelectric substrate 10. The difference in insertion loss is calculated by subtracting the insertion loss in the comparative example from the insertion loss in the second embodiment. It is assumed that the acoustic wave devices 100R and 200 are transmission filters in a duplexer supporting W-CDMA Band I, and a passband is located in a transmission band of W-CDMA Band I (1920 to 1980 MHz). The surfaces 110b and 10b contact a metal, are made of $LiTaO_3$, and have a thickness varied from 0.05 to 0.25 mm. The insulating layer 24 is assumed to be made of silicon oxide, and to have a thickness of 150 nm. FIG. 4B is a graph illustrating the difference in insertion loss. A horizontal axis represents the thickness of the piezoelectric substrate 10, and a vertical axis represents the difference in insertion loss.

As illustrated in FIG. 4B, the difference in insertion loss becomes large as the thickness of the piezoelectric substrate 10 becomes thin. This demonstrates that the frequency characteristic in the second embodiment exhibits an insertion loss lower than that in the comparative example more significantly as the thickness of the piezoelectric substrate 10 becomes thinner. This is because the high-frequency signal leaks in the comparative example because the parasitic capacitance increases when the piezoelectric substrate 10 is thin, but the increase in the parasitic capacitance is suppressed in the second embodiment. The difference in insertion loss becomes large especially in a range where the thickness of the piezoelectric substrate 10 is smaller than or equal to 0.15 mm, and the insertion loss is improved by approximately 0.1 dB when the thickness is smaller than or equal to 0.135 mm, and by more than or equal to 0.15 dB when the thickness is smaller than or equal to 0.1 mm.

A description will now be given of a fabrication method of the acoustic wave device 200. FIG. 5A through FIG. 5D are cross-sectional views illustrating a first example of the fabrication method of the acoustic wave device in accordance with the second embodiment, and illustrate the IDT 12, the reflectors 14 and the input terminal In. The line patterns 16 and 16a, the output terminals Out1 and Out2, and the ground terminal GND are formed at the same time as the formation of the input terminal In although they are not illustrated.

As illustrated in FIG. 5A, the insulating layer 24 is formed on the surface 10a of the piezoelectric substrate 10 by sputtering for example. As illustrated in FIG. 5B, a metal layer (not illustrated) such as an Al layer is formed on the surface 10a by evaporation or sputtering for example, and a resist (not illustrated) is then formed on the metal layer. The resist is patterned, and the metal layer is then, for example, etched to form the IDT 12 and the reflectors 14. As illustrated in FIG. 5C, the first layer 18 is formed on the insulating layer 24 by etching after evaporation or sputtering for example. As illustrated in FIG. 5D, the protective layer 22 is formed. The second layer 20 is formed on the first layer 18 (illustration is omitted).

As described previously, the parasitic capacitance is significantly reduced by making the thickness of the insulating layer 24 thick. However, when the insulating layer 24 is thick, for example, more than or equal to 400 nm, it becomes difficult to adjust a focal point of an exposure apparatus on both of the piezoelectric substrate 10 and the insulating layer 24 simultaneously, and accuracy of pattern widths of the IDT 12 and the reflectors 14 becomes a problem. Therefore, the IDT 12 and reflectors 14 are preferably formed separately from the formation of the first layer 18 as described in the first example. The fabrication process can be simplified by making the insulating layer 24 thin to the extent that the parasitic capacitance can be reduced to a desired value. A description will be given of an example that simplifies the fabrication process.

FIG. 5E through FIG. 5G are cross-sectional views illustrating a second example of the fabrication method. As illustrated in FIG. 5E, the insulating layer 24 with a thickness of 150 nm is formed on the surface 10a. As illustrated in FIG. 5F, the metal layer such as an Al layer is formed on the surface 10a and the insulating layer 24, and a resist is then patterned. The metal layer is, for example, etched to form the first layer 18, the IDT 12 and the reflectors 14. As illustrated in FIG. 5G, the protective layer 22 is formed on the IDT 12 and the reflectors 14.

As the insulating layer 24 is thin, for example, approximately 150 nm, the focal point of the exposure apparatus can be adjusted on both of the piezoelectric substrate 10 and the insulating layer 24 simultaneously. Therefore, the IDT 12, the reflectors 14, and the first layer 18, which is a part of the input terminal In, can be formed simultaneously, and accordingly, the fabrication process is simplified. The first layer 18 included in the line patterns 16 and 16a, the output terminals Out1 and Out2 and the ground terminal GND is formed at the same time as the formation of the IDT 12 and the reflectors 14. The terminals, the line patterns 16 and 16a may have a single layer structure, and in this case, the terminals, the line patterns 16 and 16a, the IDT 12 and the reflectors 14 can be formed simultaneously. The terminals and the line patterns 16 and 16a may have three or more layers. When the terminals and the line patterns 16 and 16a include the same metal layer as the IDT 12 and the reflectors 14, at least a part of the terminals and the line patterns 16 and 16a is formed at the same time as the formation of the IDT 12 and the reflectors 14.

A description will be given of another example that simplifies the fabrication process. FIG. 5H through FIG. 5J are cross-sectional views illustrating a third example of the fabrication method.

As illustrated in FIG. 5H, the IDT 12 and the reflectors 14 are formed on the surface 10a. As illustrated in FIG. 5I, an insulating layer 23 is formed on the surface 10a so as to cover the IDT 12 and the reflectors 14. As illustrated in FIG. 5J, the first layer 18 is formed on the insulating layer 23. The insulating layer 23 located on the IDT 12 and the reflectors 14 functions as the protective layer 22 illustrated in FIG. 3B, and the insulating layer 23 under the first layer 18 functions as the insulating layer 24. The insulating layer 24 and the protective layer 22 are formed simultaneously, and accordingly, the fabrication process is simplified.

Third Embodiment

Figure 6A:
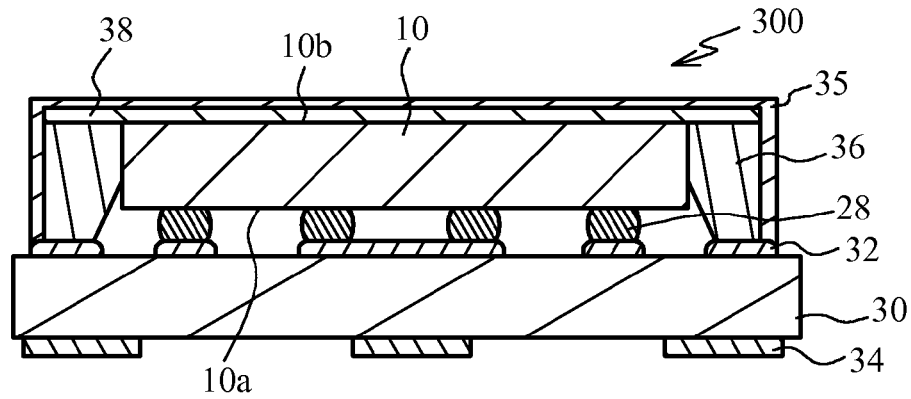
FIG. 6A is a cross-sectional view of an acoustic wave device in accordance with a third embodiment.

A third embodiment seals the piezoelectric substrate 10. FIG. 6A is a cross-sectional view of an acoustic wave device 300 in accordance with the third embodiment. The IDT 12, the reflectors 14, the line patterns 16, the protective layer 22, the insulating layer 24 and the terminals have the same configuration as those of the first embodiment or the second embodiment, and an illustration is omitted.

As illustrated in FIG. 6A, the piezoelectric substrate 10 is flip-chip mounted on a mounting substrate 30 by bumps 28. FIG. 6A illustrates the piezoelectric substrate 10 of FIG. 3B upside down, and the surface 10a, on which the resonators and the terminals are located, faces the mounting substrate 30. Conductive layers 32 and 34 are provided to the mounting substrate 30. The conductive layers 32 and 34 include a metal such as tungsten (W), silver (Ag), Cu or Al, or an alloy including these metals, and further includes a plating layer formed of Au or the like. The conductive layer 32 is connected to the conductive layer 34 by line patterns located in the mounting substrate 30. The terminals located on the piezoelectric substrate 10 are connected to the conductive layer 32 located on an upper surface of the mounting substrate 30 via the bumps 28. The conductive layer 34 located on a bottom surface of the mounting substrate 30 functions as a foot pad for external connection. The high-frequency signal input from the conductive layer 34 is input to the input terminal In located on the piezoelectric substrate 10 through the conductive layer 32 and the bumps 28.

The piezoelectric substrate 10 is sealed by a sealing portion 36, which contacts a side surface of the piezoelectric substrate 10, and a lid 38 (metal layer) which contacts the surface 10b. The sealing portion 36 surrounds the piezoelectric substrate 10, and is bonded to the conductive layer 32 and the lid 38. A metal layer 35 formed of a metal such as nickel (Ni) is provided so as to cover surfaces of the sealing portion 36 and the lid 38. The bumps 28 and the sealing portion 36 are made of a metal such as solder mainly including tin silver (Sn—Ag). The lid 38 includes a metal such as kovar. The third embodiment can reduce the parasitic capacitance, and thus improve the high-frequency characteristic even when the piezoelectric substrate 10 contacts the lid 38. The lid 38 may be located above the surface 10b so as not to contact the surface 10b, and the sealing portion 36 may be located between the lid 38 and the surface 10b. A description will now be given of a variation of the embodiment.

Figure 6B:
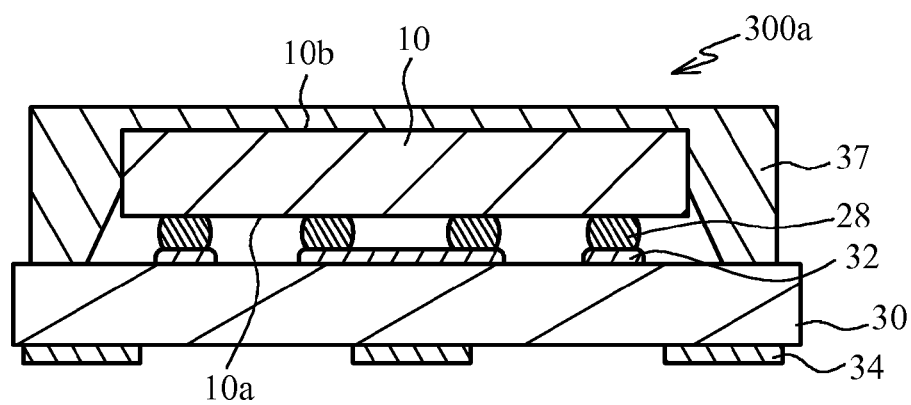
FIG. 6B is a cross-sectional view of an acoustic wave device in accordance with a first variation of the third embodiment.
Figure 6C:
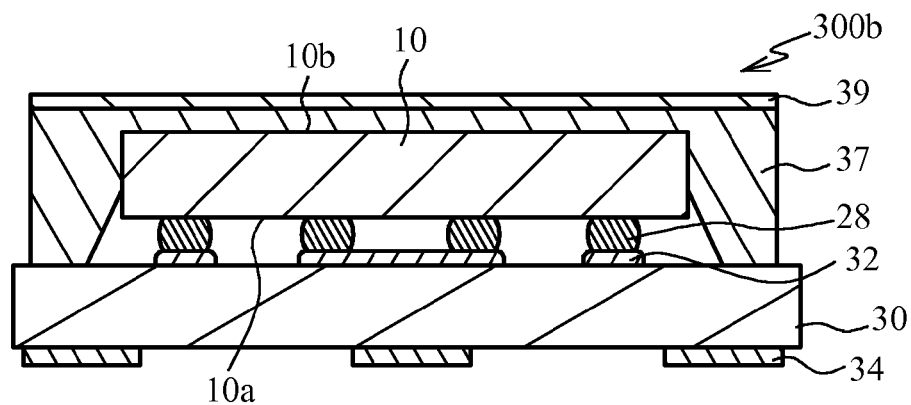
FIG. 6C is a cross-sectional view of an acoustic wave device in accordance with a second variation of the third embodiment.

FIG. 6B is a cross-sectional view of an acoustic wave device 300a in accordance with a first variation of the third embodiment. As illustrated in FIG. 6B, the piezoelectric substrate 10 is sealed by a sealing portion 37 that contacts the surface 10b and side surface of the piezoelectric substrate 10. The sealing portion 37 is formed of a resin such as an epoxy resin for example. FIG. 6C is a cross-sectional view of an acoustic wave device 300b in accordance with a second variation of the third embodiment. A metal layer 39 is located on a part of or the whole of the sealing portion 37. The parasitic capacitance can also be reduced in the acoustic wave devices illustrated in FIG. 6B and FIG. 6C. In addition, the provision of the sealing portion 37 allows the piezoelectric substrate 10 not to contact the metal layer 39, and makes the distance between the piezoelectric substrate 10 and the metal layer 39 large compared to that of the embodiment illustrated in FIG. 2C. Therefore, the parasitic capacitance is effectively reduced.

Fourth Embodiment

Figure 7A:
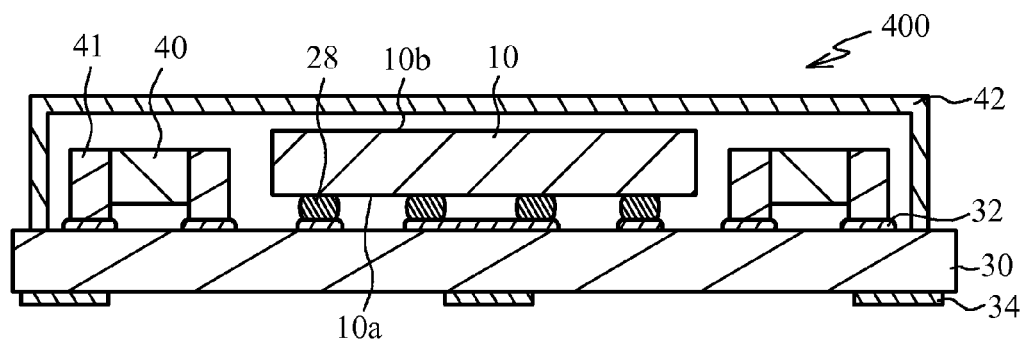
FIG. 7A is a cross-sectional view of an acoustic wave device in accordance with a fourth embodiment.

A fourth embodiment is an exemplary acoustic wave device which is modularized. FIG. 7A is a cross-sectional view of an acoustic wave device 400 in accordance with a fourth embodiment. The IDT 12, the reflectors 14, the line patterns 16, the protective layer 22, the insulating layer 24 and the terminals have the same configuration as those of the first or second embodiment, and an illustration is omitted.

As illustrated in FIG. 7A, two chip components 40 are mounted on the mounting substrate 30 by solders 41, each chip component 40 including a capacitor and an inductor. A shield 42 formed of a metal such as nickel silver is located away from and seals the piezoelectric substrate 10 and the chip components 40. Gas such as nitrogen or argon gas is retained between the shield 42 and the piezoelectric substrate 10 and chip components 40. The number of chip components 40 may be changed.

Figure 7B:
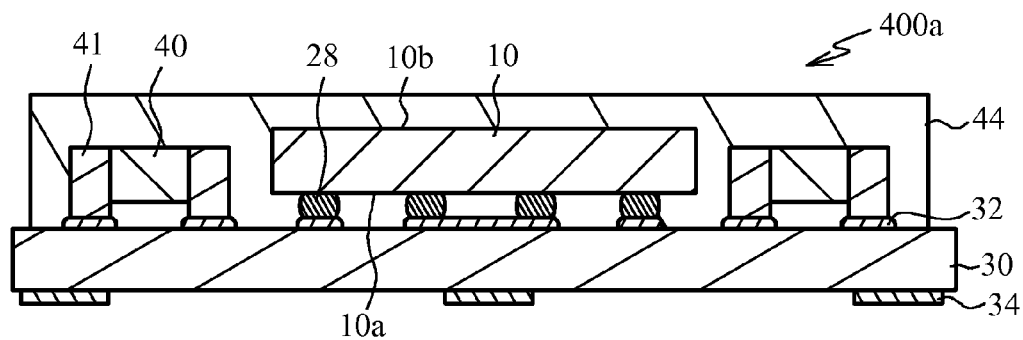
FIG. 7B is a cross-sectional view of an acoustic wave device in accordance with a first variation of the fourth embodiment.

FIG. 7B is a cross-sectional view of an acoustic wave device 400a in accordance with a first variation of the fourth embodiment. As illustrated in FIG. 7B, a sealing portion 44 formed of a resin such as an epoxy resin seals the piezoelectric substrate 10 and the chip components 40. A metal layer may be located on the sealing portion 44 of the acoustic wave device 400a.

Figure 7C:
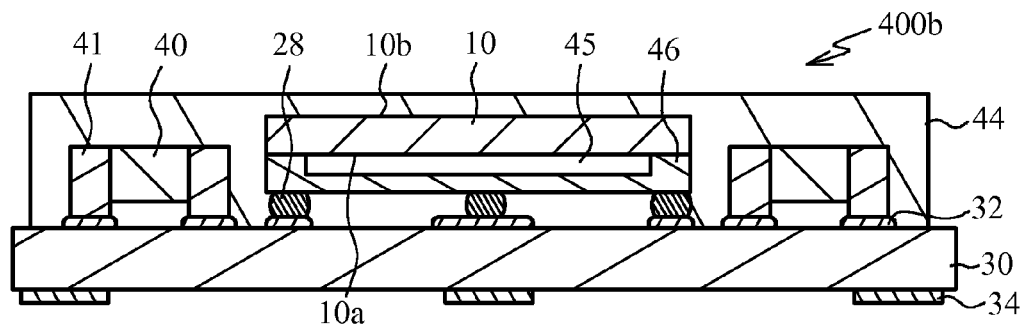
FIG. 7C is a cross-sectional view of an acoustic wave device in accordance with a second variation of the fourth embodiment.

FIG. 7C is a cross-sectional view of an acoustic wave device 400b in accordance with a second variation of the fourth embodiment. As illustrated in FIG. 7C, a sealing portion 46 formed of a resin such as an epoxy resin is provided to the surface 10a, and seals the IDT 12 and the reflectors 14 which are not illustrated. A space 45 is formed between the IDT 12 and reflectors 14 and the sealing portion 46. The terminals (not illustrated) located on the piezoelectric substrate 10 pierce through the sealing portion 46, and connect to the bumps 28. The parasitic capacitance can also be reduced in the acoustic wave device illustrated in FIG. 7C. As illustrated in FIG. 7B and FIG. 7C, the sealing portion 46 that seals the IDT 12 and reflectors 14 may be provided, or may not be provided.

Fifth Embodiment

Figure 8A:
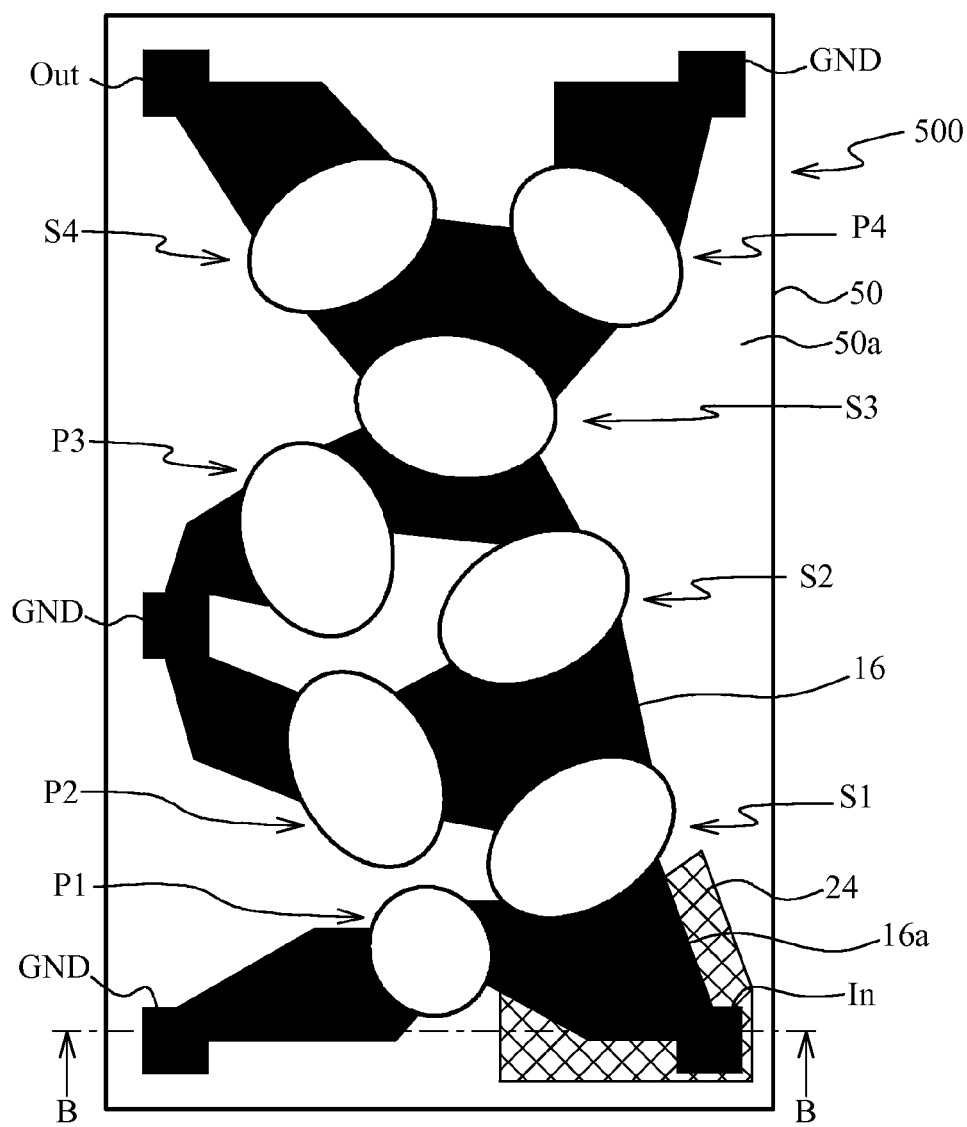
FIG. 8A is a plain view of an acoustic wave device in accordance with a fifth embodiment.
Figure 8B:
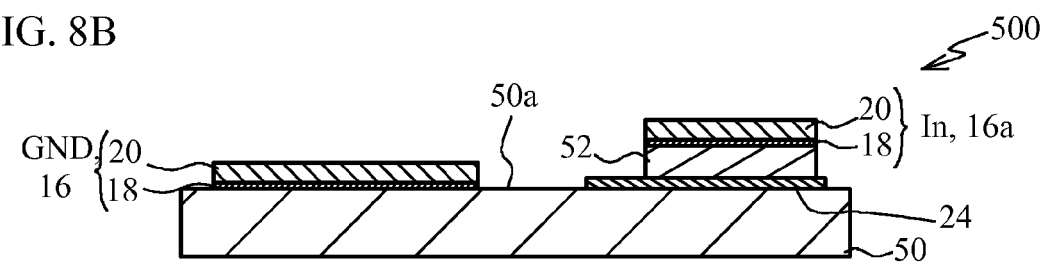
FIG. 8B is a cross-sectional view taken along line B-B in FIG. 8A.

A fifth embodiment uses an FBAR (Film Bulk Acoustic Resonator). FIG. 8A is a plain view of an acoustic wave device 500 in accordance with the fifth embodiment. FIG. 8B is a cross-sectional view taken along line B-B in FIG. 8A.

As illustrated in FIG. 8A and FIG. 8B, resonators S1, S2, S3, S4, P1, P2, P3 and P4 are FBARs, and form a ladder-type filter. The series resonators S1 through S4 are connected between the input terminal In and the output terminal Out. The output terminal Out is an unbalanced terminal. A lower electrode, a piezoelectric thin film 52 and an upper electrode are stacked above a space formed in a substrate 50 in this order from the bottom side to form a multilayered body in the FBAR. The multilayered body excites acoustic waves. The insulating layer 24 is provided on a surface 50a of the substrate 50 formed of an insulating material such as silicon (Si). The piezoelectric thin film 52 is located on the insulating layer 24, and the first layer 18 included in the input terminal In and the line pattern 16a is located on the piezoelectric thin film 52. The second layer 20 is located on the first layer 18. Si has a relative permittivity of 12, and the piezoelectric thin film 52 formed of a piezoelectric substance has a relative permittivity of, for example, approximately 9. As the insulating layer 24 has a small relative permittivity, for example, approximately 4, the parasitic capacitance can be reduced. The substrate 50 may be formed of glass or gallium arsenide (GaAs). The piezoelectric thin film 52 may not be located between the insulating layer 24 and the first layer 18, and the insulating layer 24 may contact the first layer 18. As described in the second embodiment, the insulating layer 24 may be located between the terminal other than the input terminal In and the substrate 50, and between the line pattern 16 other than the line pattern 16a and the substrate 50. As described in the third and fourth embodiments, the substrate 50 may be sealed.

A boundary acoustic wave resonator and a Love wave resonator may be used as a resonator including the IDT 12 besides the SAW resonator. The piezoelectric thin film resonator may be an SMR (Solid Mounted Resonator) in which an acoustic reflection film is located on the substrate besides the FBAR. It is possible to form one of a ladder-type filter and a multimode filter, a filter other than the ladder-type filter and multimode filter, or a duplexer including a transmission filter and reception filter in the piezoelectric substrate 10 and the substrate 50. Silicon oxide, which is a material for the insulating layer 24, may be silicon dioxide (SiO$_2$), or the one including Si and oxygen (O) besides SiO$_2$. The insulating layer 24 may be formed of an insulating material such as polyimide besides silicon oxide as long as it has a relative permittivity smaller than those of the piezoelectric substrate 10 and the substrate 50. It is possible to ground the metal layer 26 illustrated in FIG. 2C, the metal layer 35, sealing portion 36 and lid 38 illustrated in FIG. 6A, the metal layer 39 illustrated in FIG. 6C, and the shield 42 illustrated in FIG. 7A.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   an input pad that is located on a first surface of the substrate, and to which a high-frequency signal is input;
   a resonator that is connected to the input pad, and to which the high-frequency signal input to the input pad is input, the resonator including an electrode located in contact with the first surface of the substrate;
   an input line pattern that is located on the first surface of the substrate and that connects the resonator to the input pad; and
   an insulating layer that is located in an entire area under the input pad on the first surface of the substrate and in an entire area under the input line pattern on the first surface of the substrate, and that has a relative permittivity smaller than that of the substrate, the insulating layer being absent under the electrode included in the resonator on the first surface of the substrate and extending beyond edges of the input pad and the input line pattern.

2. The acoustic wave device according to claim 1, further comprising:
   a metal layer that is located on a second surface facing the first surface of the substrate.

3. The acoustic wave device according to claim 2, wherein the metal layer contacts the second surface.

4. The acoustic wave device according to claim 2, wherein the substrate is flip-chip mounted on a mounting substrate so that the first surface faces the mounting substrate, and
   the metal layer seals the substrate.

5. The acoustic wave device according to claim 1, wherein the insulating layer includes silicon oxide or polyimide.

6. The acoustic wave device according to claim 1, wherein the substrate is a piezoelectric substrate including a piezoelectric substance, and
   the resonator is an acoustic wave resonator including an IDT (InterDigital Transducer),
   the insulating layer is absent between the IDT and the substrate.

7. The acoustic wave device according to claim 1, further comprising:
   an output pad that is located on the first surface, and from which a high-frequency signal output from the resonator is output;
   a line pattern that is located on the first surface, and connects a plurality of the resonators; and
   another insulating layer that is located between the output pad and the substrate and between the line pattern and the substrate.

8. The acoustic wave device according to claim 1, wherein the insulating layer does not extend to an edge of the first surface of the substrate.

9. The acoustic wave device according to claim 1, further comprising
   another pad and another line pattern that is located on the insulating layer and does not connect to the input pad and the input line pattern.

10. The acoustic wave device according to claim 1, wherein
    the electrode is a metal layer.

11. A fabrication method of an acoustic wave device comprising:
    forming an insulating layer on a first surface of a substrate, the insulating layer having a relative permittivity smaller than that of the substrate and being absent on at least a portion of the first surface of the substrate;
    forming an input pad, to which a high-frequency signal is input, on the insulating layer, the insulating layer extending beyond an edge of the input pad;
    forming an input line pattern connecting the resonator to the input pad, on the insulating layer, the insulating layer extending beyond an edge of the input line pattern; and
    forming a resonator, which is connected to the input pad and to which the high-frequency signal input to the input pad is input, on the at least portion of the first surface, the resonator including an electrode located in contact with the first surface of the substrate,
    wherein an entirety of the input pad and an entirety of the input line are formed on the insulating layer.

12. The fabrication method of the acoustic wave device according to claim 11, wherein
the forming the resonator includes forming an IDT on the first surface of the substrate where the insulating layer is absent, and
at least a part of the input pad and the IDT are formed simultaneously.

13. The fabrication method of the acoustic wave device according to claim 11, wherein
the forming the resonator includes forming an IDT on the first surface of the substrate where the insulating layer is absent, and
the insulating layer is formed on the IDT.

14. An acoustic wave device comprising:
a substrate;
an input terminal that is located on a first surface of the substrate, and to which a high-frequency signal is input;
a resonator that is connected to the input terminal, and to which the high-frequency signal input to the input terminal is input;
an insulating layer that is located between the input terminal and the substrate, and has a relative permittivity smaller than that of the substrate, the insulating layer being absent on at least a portion of the first surface of the substrate,
an output terminal on the first surface of the substrate, from which a high-frequency signal output from the resonator is output; and
a ground terminal on the first surface of the substrate to connect the resonator to a ground,
wherein the insulating layer is absent between the output terminal and the substrate and between the ground terminal and the substrate.

15. The acoustic wave device according to claim 14, further comprising:
a line pattern on the first surface of the substrate connecting the resonator to the input terminal,
wherein the insulating layer is provided between the line pattern and the substrate.

* * * * *